United States Patent
Stoica

(10) Patent No.: US 7,072,814 B1
(45) Date of Patent: Jul. 4, 2006

(54) EVOLUTIONARY TECHNIQUE FOR AUTOMATED SYNTHESIS OF ELECTRONIC CIRCUITS

(75) Inventor: Adrian Stoica, Altadena, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 906 days.

(21) Appl. No.: 10/061,066

(22) Filed: Jan. 29, 2002

Related U.S. Application Data

(63) Continuation-in-part of application No. 09/395,235, filed on Sep. 13, 1999, now Pat. No. 6,728,666.

(51) Int. Cl.
*G06F 17/50* (2006.01)

(52) U.S. Cl. .............. 703/13; 716/1; 716/2; 716/4; 716/6

(58) Field of Classification Search .............. 716/1–22; 700/121; 703/13, 14, 2; 707/6; 706/13; 257/E21.525; 702/181; 714/732, 738–741
See application file for complete search history.

(56) References Cited

U.S. PATENT DOCUMENTS

| | | | | |
|---|---|---|---|---|
| 5,258,947 A | | 11/1993 | Sourgen ................... 365/96 |
| 5,636,125 A | * | 6/1997 | Rostoker et al. ........... 700/121 |
| 5,668,732 A | * | 9/1997 | Khouja et al. ............. 702/60 |
| 5,677,691 A | | 10/1997 | Hosticka et al. ........... 341/155 |
| 5,705,938 A | | 1/1998 | Kean ....................... 326/39 |
| 5,790,436 A | * | 8/1998 | Chen et al. ................ 716/5 |
| 5,867,397 A | * | 2/1999 | Koza et al. ................ 703/14 |
| 5,897,628 A | | 4/1999 | Kitano ..................... 706/13 |
| 5,959,871 A | | 9/1999 | Pierzchala et al. .......... 364/489 |
| 5,970,487 A | | 10/1999 | Shackleford et al. ........ 707/6 |
| 6,360,191 B1 | | 3/2002 | Koza et al. ................ 703/6 |
| 6,363,517 B1 | | 3/2002 | Levi et al. ................. 716/16 |
| 6,363,519 B1 | | 3/2002 | Levi et al. ................. 716/16 |
| 6,378,122 B1 | | 4/2002 | Levi et al. ................. 716/16 |
| 6,728,666 B1 | * | 4/2004 | Stoica et al. .............. 703/13 |
| 6,851,097 B1 | * | 2/2005 | Zhang et al. .............. 716/5 |
| 2002/0072872 A1 | * | 6/2002 | Chatterjee et al. ......... 702/117 |
| 2003/0006413 A1 | * | 1/2003 | Chawla et al. ............. 257/48 |
| 2004/0031001 A1 | * | 2/2004 | Zhang et al. .............. 716/4 |
| 2005/0114111 A1 | * | 5/2005 | Zhang et al. .............. 703/14 |

OTHER PUBLICATIONS

Peter Vancorenland, C. De Ranter, M. Steyaert, G. Gielen□□Optimal RF Deisgn Using Smart Algorithm□□2000 ACM 1-58113-188-7□□DAC 2000, Los Angeles, CA.*

Tetsuya Higuchi, Nobuki Kajihara□□Evolvable Hardware Chips for Indistrial Applications□□April 1999/vol. 42, No. 4 Communication of the ACM.*

Melvin A. Breuer, Alice C. Parker□□Digital System Simulation: Currentl Status and Future Trends of Carwin's Theory of Simulation□□0146-7123/81/0000-0269, 1981 IEEE, 18th Design Automation Conference.*

(Continued)

*Primary Examiner*—Kamini Shah
*Assistant Examiner*—Cuong Van Luu
(74) *Attorney, Agent, or Firm*—Mark Homer

(57) ABSTRACT

A method of evolving a circuit uses a heterogenous mix of models of both high and low levels of resolution.

19 Claims, 11 Drawing Sheets

OTHER PUBLICATIONS

Michael Krasnicki, Rodney Phelps, Rob A. Rutenbar, L. Richard Carley□□Maelstrom: Efficient Simulation-Based Synthesis for Custom Analog Cells□□DAC 99, New Orleans, LA□□1999 ACM 1-58113-109-7/99/06.*

Neil H. E. Weste, Kamran Eshraghian□□Principles of CMOS VLSI Design: A Systems Perspective, Second Edition, 1993□□Addison-Wesley Publishing Company□□.*

Layzell, P., "A New Research Tool for Intrinsic Hardware Evolution", 1998, Second International Conference ICES98, pp. 47-56.

Perkowski, M., Chebotarev, A., and Mishchenko, A., "Evolvable Hardware or Learning Hardware? Induction of State Machines from Temporal Logic Constraints," Jul. 1999, Proceedings of the First NASA/ DoD Workshop.

Stoica, Adrian, "Toward Evolvable Hardware Chips: Experiments with a Programmable Transistor Array," Apr. 1999, Proceedings of the Seventh International Conference.

Stoica, A., Keymeulen, D., Salazar-Lazaro, C., Hayworth, K., and Tawel, Raoul, "Toward On-board Synthesis and Adaption of Electronic Functions: An Evolvable Hardware Approach," Mar. 1999, IEEE, vol. 2, pp. 351-357.

Stoica, A., Keymeulen, D., Tawel, R., Salazar-Lazaro, C., and Li, W., "Evolutionary experiments with a fine-grained reconfigurable architecture for analog and digital CMOS circuits," Jul. 1999, Proceedings of the First NASA/DoD Workshop.

Stoica, A., Klimeck, G., Salazar-Lazaro, C., Keymeulen, D., and Thakoor, A., "Evolutionary Design of Electronic Devices and Circuits," Jul. 1999, IEEE, vol. 3, pp. 1271-1278.

Bennett III, F., Andre, D., Koza, J.R., and Keane, M.A., "Evolution of a 60 decibel Op Amp using genetic programming," First International Conference, *ICES96*, Tsukuba, Japan, Oct. 7-8, 1996, Springer, pp. 455-469.

Flockton, Stuart, J., and Sheehan, Kevin, "Intrinsic Circuit Evolution Using Programmable Analogue Arrays," Second International Conference, *ICES98*, Lausanne, Switzerland, Sep. 23-25, 1998, Springer, pp. 144-153.

Iba, H., Iwata, M. and Higuchi, T., "Machine Learning Approach to Gate-Level Evolvable Hardware," First International Conference, *ICES96*, Tsukuba, Japan, Oct. 7-8, 1996, Springer, pp. 327-343.

Kajitani, I., Hoshino, T., Nishikawa, D., Yokoi, H., Nakaya, S., Yamauchi, T., Inuo, T., Kajihara, N., Iwata, M., Keymeulen, D., Higuchi, T., "A Gate-Level Ettwchip: Implementing GA Operations and Reconfigurable Hardware on a Single LSI," Second International Conference, *ICES98*, Laussane, Switzerland, Sep. 23-25, Springer, pop. 1-12.

Koza, J.R., Andre, D., Bennett III, F., Keane, M.A., Reuse Parameterized Reuse, and Hierarchical Reuse of Substructures in Evolving Electrical Circuits Using Genetic Programming, First International Conference, *ICES96*, Tsukuba, Japan, Oct. 7-8, 1996, Springer, pp. 312-325.

Koza, J.R., Bennett III, F.H., Andre, D., Keane, M.A., "Automated WYWIWYG Design of Both the Topology and Component Values of Electrical Circuits Using Genetic Programming," *Proceedings of Genetic Programming Conference*, Stanford, 1996, pp. 28-31.

Koza, J.R., Dunlap, F., Bennett III, F., Keane, M.A., Lohn, J., and Andre, D., "Automated Synthesis of Computational Circuits Using genetic Programming," *IEEE Transactions on Evolutionary Computation*, vol. 1, No. 2, 1997, pp. 109-128.

Lohn, Jason D., and Colombano, S.P., "Automated Analog Circuit Synthesis Using a Linear Representation," Second International Conference, *ICES98*, Lausanne, Switzerland, Sep. 23-25, Springer, 1998, pp. 125-133.

Murakawa, M., Yoshizawa, S., Adachi, T., Suzuki, S., Takasuka, K., Iwata, M., Higuchi, T., "Analogue EHW Chip for Intermediate Frequency Filters," Second International Conference, *ICES98*, Lausanne, Switzerland, Sep. 23-25, 1998, Springer, pp. 132-143.

Stoica, A., "On Hardware Evolvability and Levels of Granularity," *International Conference on Intelligent Systems and Semiotics*, NIST Gaithersburg, VA, Sep. 1997, pp. 1-4.

Thompson, Adrian, "Silicon Evolution," *Proceedings of Genetic Programming, MIT Press*, 1996, pp. 75-90.

Thompson, Adrian, "On the Automatic design of Robyst Electronics Through Artificial Evolution," Second International Conference, *ICES98*, Lausanne, Switzerland, Sep. 23-25, Springer, 1998, pp. 13-24.

Thompson, Adrian, "An Evolved Circuit, Intrinsic in Silicon, Entwined with Physics," First International Conference, *ICES96*, Tsukuba, Japan, Oct. 7-8, Springer, 1996, pp. 390-405.

Zebulum, R.S., Pacheco, M.A., Vellasco, M., "Evolvable Systems in Hardware design: Taxonomy, Survey and Applications," First International Conference, *ICES96*, Tsukuba, Japan, Oct. 7-8, Springer, 1996, pp. 344-358.

Zebulum, R.S., Pacheco. Marco, A., Vellasco, M., "Analog Circuits Evolution in Extrinsic and Intrinsic Modes," Second International Conference, *ICES98*, Lausanne, Switzerland, Sep. 23-25, Springer, 1998, pp. 154-165.

* cited by examiner

EVOLUTIONARY TECHNIQUE FOR AUTOMATED SYNTHESIS OF ELECTRONIC CIRCUITS

CROSS-REFERENCE TO RELATED APPLICATIONS

This application is a continuation-in-part of U.S. patent application Ser. No. 09/395,235 filed Sep. 13, 1999 now U.S. Pat. No. 6,728,666 by Adrian Stoica et al. entitled "EVOLUTIONARY TECHNIQUE FOR AUTOMATED SYNTHESIS OF ELECTRONIC CIRCUITS" and assigned to the assignee of the present application.

BACKGROUND

Evolvable Hardware or EHW is reconfigurable hardware that self-configures under the control of an evolutionary algorithm. In evolutionary electronics, the search for an electronic circuit reconfiguration can be made in software and the final solution downloaded or become a blueprint for hardware, which is referred to as extrinsic evolution. Alternatively, evolution can be performed directly in hardware, referred to as intrinsic evolution. With intrinsic evolution, solutions may be evolved directly on a chip.

The main steps of evolutionary synthesis are illustrated in FIG. 1. First, a population of chromosomes is randomly generated. The chromosomes are converted into circuit models for extrinsic EHW, or control bit strings downloaded to programmable hardware intrinsic EHW. Circuit responses are compared against specifications of a target response, and individuals are ranked based on how close they come to satisfying it. In preparation for a new iteration loop, a new population of individuals is generated from the pool of best individuals in the previous generation, some of these individuals are taken as they were and some are modified by genetic operators such as chromosome crossover and mutation. This process is repeated for many generations, and results in increasingly better individuals. Such a process is usually stopped after a number of generations, or when the closeness to the target response has reached a sufficient degree. One of several solutions may be found among the individuals of the last generation.

A variety of circuits have been synthesized through extrinsic evolutionary means. For example, Koza et al., in U.S. Pat. No. 5,867,397, issued on Feb. 2, 1999, entitled METHOD AND APPARATUS FOR AUTOMATED DESIGN OF COMPLEX STRUCTURES USING GENETIC PROGRAMMING, herein incorporated by reference in its entirety, used Genetic Programming (GP) to grow an "embryonic" circuit to a circuit that satisfies desired requirements. This approach was used for evolving a variety of circuits, including filters and computational circuits. An alternative encoding technique using a linear representation, which has the advantage of reduced computational load, has been used in for automated filter design.

With these extrinsic approaches, though, evolutions of analog circuits were performed in simulations, without concern of a physical implementation, but rather, as a proof-of-concept that evolution can lead to designs that compete or even exceed the performance of human designs. Although in principle, one can test their validity in circuits built from discrete components, or in an ASIC, no analog programmable devices exist that would support the implementation of the resulting design. Thus, these approaches do not provide a practical solution to intrinsic evolution.

Intrinsic evolution can speed-up the search for a solution circuit by a few orders of magnitude compared to evolution in software simulations, specifically if one simulates large, complex analog circuits, and if the circuit response is rapid. Moreover, since the software simulation relies on models of physical hardware with limited accuracy, a solution evolved in software may behave differently when downloaded in programmable hardware; such mismatches are avoided when evolution takes place directly in hardware. Further, unlike software evaluation where more complex circuitry and more accurate modeling takes longer to evaluate, hardware evolution scales well with both size of the circuits and model accuracy, thus providing less significant increases in evaluation time.

Although reconfigurable devices exist, they have a limited range of possible applications. On-chip evolution was demonstrated by A. Thompson, in *Silicon Evolution*, in Proceedings of Genetic Programming 1996 (GP96), MIT Press, herein incorporated by reference in its entirety, using a Field Programmable Gate Array or FPGA as a programmable digital device, and a Genetic Algorithm or GA as the evolutionary mechanism.

Such a technique using gate arrays, however, is not practical for analog circuit evolution. Logical gates are not good elementary building blocks for analog circuits as they are designed optimized for logical/binary behaviors. For example, transistor interconnections that are designed to facilitate digital logic signals and flows do not necessarily provide good analog response and signal flow. The usage of the gate array for evolution can result in exploitation by evolution, of parasitic and unintended signal paths and functioning modes for the components. As a result, circuits may evolve in one region of a chip that can not be replicated in other parts, or on other chips, although the same genetic code is used.

Moreover, conventional on chip evolution has not provided sufficient granularity for practical applications. While several levels of granularity are in use, the most common digital devices are configurable at the gate-level. In the analog programmable devices, such as in Field Programmable Analog Arrays or FPAAs, the reconfigurable active elements are Operational Amplifiers, which have only very coarse granularity and little functionality with good precision, thus having only a limited range of possible applications.

Analog circuit design has been lost as a technique for computing because analog circuits were not easily programmable, and required precise components with no drifts. If the evolutionary mechanism and process proves sufficiently powerful for evolving complex analog circuits, then its combination with reconfigurable analog devices potentially will be able to capture the benefits of analog in new applications. As such, the potential of analog processing is much greater than what is able to be exploited today.

Analog circuitry has advantages in cost, size and power consumption (as compared to digital circuitry) and can directly process signals that are continual in time and amplitude. Even a single transistor has many functions such as generation of square, square-root, exponential and logarithmic functions, voltage-controlled current sources; analog multiplication of voltages, and short term and long term analog storage. As such, the basic combinations of transistors offer a rich repertoire of linear and nonlinear operators available for local and collective analog processing. Using evolution, the benefits of analog processing can be exploited, while its disadvantages reduced or even eliminated.

Also, it has been recognized by the inventors herein that evolutionary searches may perform significantly better with analog than with digital circuitry. A possible explanation lies in the fact that analog behaviors have relatively smoother spaces, which is better for the evolutionary search. Thus, new perspectives are possible: evolutionary searches offering automatic programming; sufficiently precise equivalent components could be obtained if the programmable analog components offer controllably of their operating points; and drifts that can be compensated for by adjusting operating points or, if the drifts are too strong, by a new search for a different optimal circuit configuration and operating point. Moreover, analog computation on simple low-power circuits can boost emerging applications areas of "smart matter" and distributed high bandwidth adaptive sensing.

Furthermore, a hardware implementation also offers a big advantage in evaluation time for a circuit; the time for evaluation is determined by the goal function. For example, considering an A/D converter operating at a 100 kHz sampling rate the electronic response of the A/D converter is available within 10 microseconds, compared to (an over-optimistic) 1 second on a fast computer running SPICE; this advantage increases with the complexity of the circuits. In this case, the $10^5$ speedup would allow evaluations of populations of millions of individuals in seconds instead of days. Moreover, the higher the frequency at which a circuit needs to function, the shorter is its evaluation time, making the design of very high frequency circuits an excellent candidate for intrinsic evolutionary design.

In the above-described software modeling approaches, a particular type of model is selected to perform an evolutionary search of a population of circuits meeting predefined behavioral requirements. In an extrinsic simulation, software models simulate dynamic behavior of candidate circuits. The response of each candidate circuit to a predetermined stimulus is compared against a desired response, and the difference is quantified as the fitness function. As a simple example, an analog circuit may be required that produces a gaussian-shaped output voltage in response to a ramped input voltage. A summation over time of the differences between the desired output voltage and the actual output voltage of a candidate circuit may be used as the fitness function (or "score") of the candidate circuit. The evolutionary process includes testing the response of each candidate circuit and ranking them by the resulting scores. The candidates having the best fitness functions or scores are retained for the next iteration while those with the worst scores are eliminated from subsequent iterations of the evolutionary process.

In extrinsic or software modeling, the choice of software model determines the reproducability of the model in hardware. In either type of modeling, the choice is typically between a more robust model and a less robust model. In extrinsic modeling, the more robust software models are more complex but exhibit more realistic behavior that better follows real hardware behavior. In intrinsic modeling, the more robust models have more hardware switches (for example) so that more choices of circuit configurations are available. In either case, the choice of model determines the speed with which the simulation and search can occur and whether the simulation can converge to a solution within a practical time frame. In fact, there is a tradeoff between speed of convergence and hardware reproducability. For example, in software modeling, the more robust models are more faithful to real hardware behavior but require solution of a larger number of equations, which lengthens the time required for convergence and may prevent convergence. In hardware modeling, the more robust models correspond to a larger search space, which typically lengthens the time of the search or convergence, and may prevent convergence within a practical time.

One way around this problem is to use simpler models whose convergence is sure and rapid. For example, in software modeling, one could use a very simple software model of each circuit. There are many levels of SPICE models from which one may choose to perform a simulation and search, and a simpler or lower resolution model would correspond to a lower level of SPICE modeling (e.g., SPICE level 5 instead of level 7). This solution may better promote convergence when modeling a very complex system, such as an analog-to-digital converter, but the lower resolution models typically cannot be relied upon to provide solutions or circuits that, when reproduced in hardware, exhibit the simulated behavior. A similar dilemma is present in hardware modeling. For example, one could employ reconfigurable hardware in intrinsic modeling in which the number of switches is reduced (i.e., some switches are frozen in pre-defined states) to limit the number of choices or reduce the search space. However, such a limitation may exclude the candidate circuits that represent the only solutions to a particular search problem, or at least the best solutions.

SUMMARY OF THE DISCLOSURE

A method of evolving a circuit uses a heterogenous mix of models of both high and low levels of resolution. In one embodiment, every candidate solution is modeled with many or all models corresponding to many or all possible levels of resolutions. For each candidate circuit, the fitness functions or the various models of that circuit are combined in evaluating the candidate circuit.

In another embodiment, each candidate circuit is modeled with a single model, different candidates being assigned models of different resolution levels. With each iteration of the simulation, each candidate circuit is assigned a different resolution level model, so that after a number of iterations, each candidate circuit has been modeled with all levels of resolution. Alternatively, the reassignment to different resolution level models is performed randomly so that not all candidate circuits are assigned to a different resolution level model at each iteration of the simulation.

DESCRIPTION OF THE PREFERRED EMBODIMENTS OF THE PRESENT INVENTION

Subject Matter of the Parent Application:

The above-referenced parent application concerns a circuit adapted for use in intrinsic evolution including a programmable transistor array or PTA, which is programmable at the transistor level. In this circuit, transistors form a plurality of modules, which may be interconnected to other modules, or to other transistors of the PTA, to provide further functionality. The subject matter of the above-referenced parent application is described below with reference to FIGS. 2–5.

Figure 1:
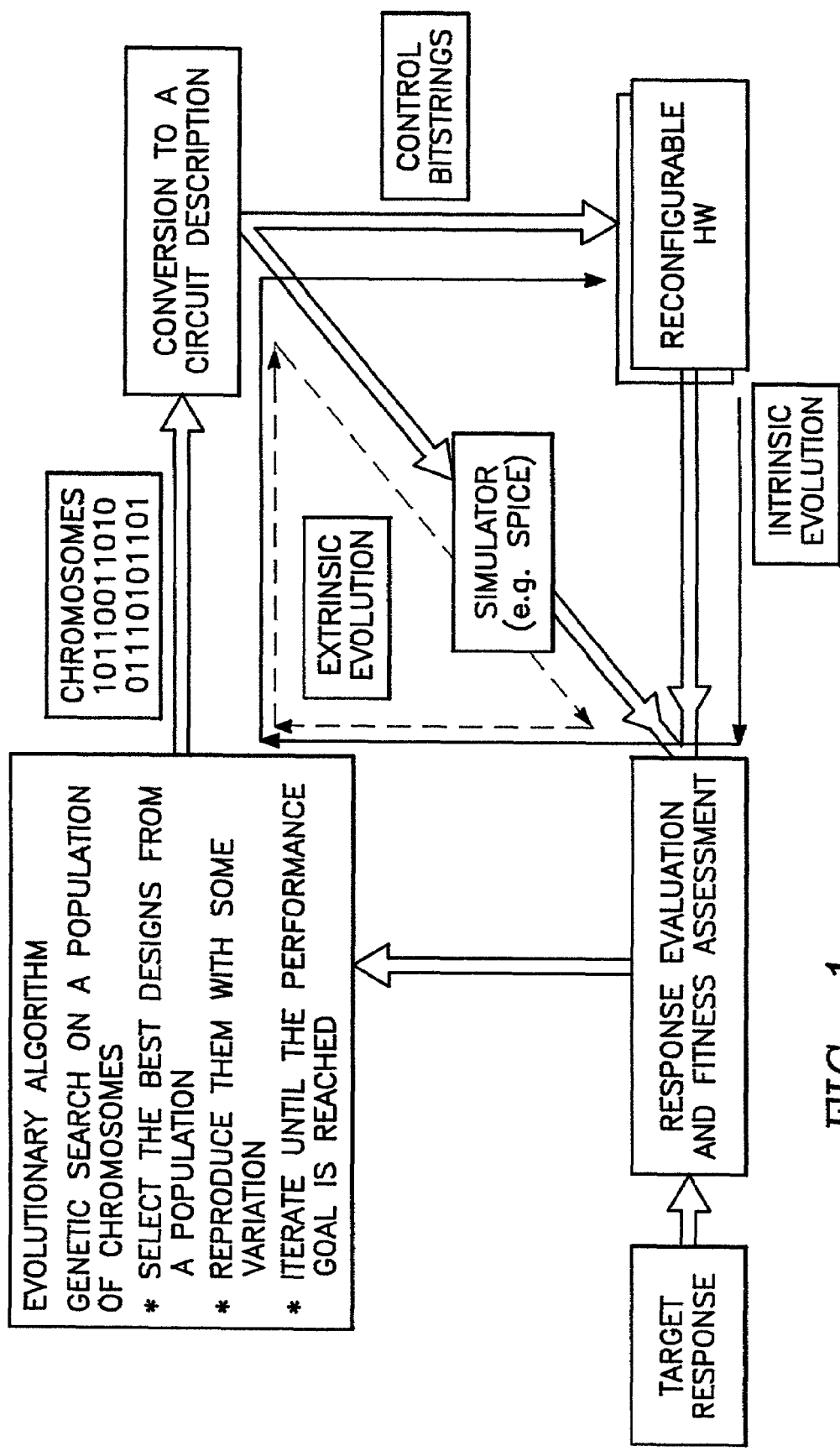
FIG. 1 shows a simplified functional block diagram of evolutionary processes.
Figure 2:
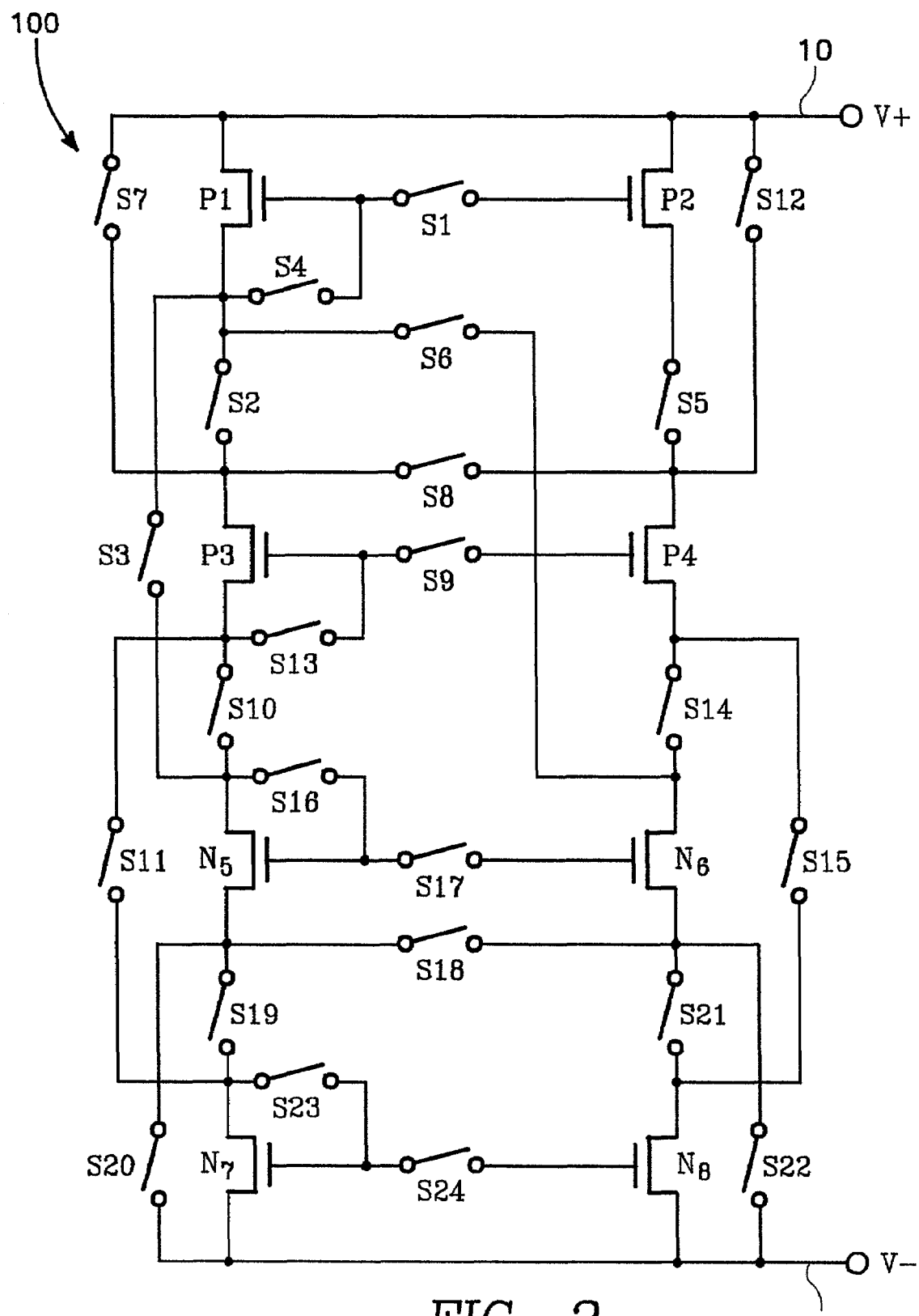
FIG. 2 is a preferred embodiment of a circuit in accordance with the present invention.

Turning to FIG. 2, the PTA module 100 is an array of transistors interconnected by programmable switches. These switches provided transistor terminal to transistor terminal, or transistor terminal to power terminal connections. The status of the switches (On or Off) determines a circuit topology and consequently a specific response. Thus, the topology can be considered as a function of switch states, and can be represented by a binary sequence, such as a chromosome pattern of "1011 . . . ", where by convention, one can assign 1 to a switch turned On and 0 to a switch turned Off. Programming the switches On and Off determines a circuit and provides a means responsive to a chromosome pattern for selectively controlling the coupling of the interconnections of the transistor array.

The PTA allows programming of both analog and digital circuits by intrinsic evolution. CMOS field effect transistors are used as the elemental building blocks, although other embodiments may employ other type devices, such as bipolar devices, single electron devices, quantum dot devices, resonant tunneling devices, optically coupled devices, or other similar devices, as elemental building blocks. CMOS transistors allow evolution to take advantage of inherent resistance and capacitance functions, as well as analog and digital transistor operation.

As all integrated circuits ultimately rely on functions implemented with transistors, the PTA of the preferred embodiment provides a versatile platform for synthesis of analog, digital, or even mixed-signal circuits using the same transistors. It also provides a more suitable platform for synthesis of analog circuitry than other reconfigurable devices and allows transferrable analog circuits to be evolved directly on the chip.

The optimal choice of elementary block type and granularity is task dependent. Reconfigurable modules 100 are based on elements of the lowest level of granularity. With such a configuration, virtual higher-level building blocks can be implemented by imposing programming constraints. An example would be forcing groups of elementary cells to act as a whole, such as by freezing certain parts of the switch configuration bit string to provide digital gates or basic analog circuits.

Thus, the PTA may provide versatile functional cells to provide a higher level of functionality. More specifically, for example, certain parts of the switch configuration bit string could be frozen to provide interconnections between the N-type transistors to form a virtual NAND gate. Ideally, the virtual blocks for evolution should be automatically defined/clustered during evolution. This concept is analogous to the Automatically Defined Functions predicted and observed in software evolution.

As such, granularity selection allows for mixed granularity solutions. Higher level functionality may be combined with elemental functionality within modules on the same chip to allow evolved circuit designs not obtainable with only higher level cells. Also, such granularity selection allows for hybrid digital/analog solutions not readily obtainable in current arrays.

FIG. 2 illustrates a PTA module 100 having 8 transistors and 24 programmable switches. The transistors P1–P4 are PMOS and N5–N8 are NMOS. The plurality of transistors P1–N8 are coupled between a power source terminal 10 and a power sink terminal 20 in a topology capable of admitting power between the power source terminal 10 and the power sink terminal 20. In FIG. 2, the plurality of transistors P1–N8 are coupled via reconfigurable switches S1–S24 so that every transistor terminal to transistor terminal interconnection is via a reconfigurable switch.

Although a reconfigurable switch may be provided between every terminal to terminal interconnection, it is possible to provide a hard connection between certain transistor terminals, such as a hard bias connection, or a gate to gate connection. Although such hard connections will limit evolutionary circuit possibilities, such a connection may be desirable, for example, when evolution will be employed to evolve a specific family of circuits employing recurrent, frequent, or common connection types, or in other circumstances.

Thus, with the preferred embodiment, the PTA has at least one contiguous region within the array where every transistor terminal to transistor terminal connection is via a reconfigurable switch. Further, in such an embodiment, at least one of the transistors within the region has every terminal connected via a reconfigurable switch to other terminals of other transistor(s) within the region.

The arrangement of reconfigurable switches S1–S24 is such that a permutation of switch states provides a majority of meaningful circuit connections of transistors P1–N8 for a selected transistor arrangement, but so that there are less than the total number of possible transistor terminal connections. Thus, the transistors P1–N8 and the switches S1–S24 are arranged so that module 100 provides an extensive number of functional circuits for the permutation of switch S1–S24 states.

One means to accomplish this is to arrange the transistors P1–N8 in layers between the power source terminal 10 and the power sink terminal 20. The interconnections of terminals of the transistors P1–N8, including transistor to power terminal coupling, transistor to transistor coupling, and transistor self coupling generally allow non-conflicting current flow paths. In general, terminals should be coupled to facilitate current flow. In other words, a terminal that typically provides current should be coupled to at least one that typically receives current. For example, a drain terminal of a P-type transistor typically is coupled via a reconfigurable switch to the source terminal of another P-type transistor, such as S2 or S5, or to a drain terminal of an N-type, such as S3, S11, or S15. Likewise, the drain of a P-type transistor typically is coupled via switch to the drain of an N-type, such as S10, S11, S14, or S15. As such, transistor P1, P3, N5, and N7, along with transistors P2, P4, N6, and N8, provide current flow paths between the power source terminal 10 and the power sink terminal 20.

Additional terminal interconnections may be used to provide additional meaningful terminal to terminal connectivity and functionality (for example, transistor bypass switches, such as by S3, S7, S11, S12, S15, S20, or S22). Also, one or more transistor bias switches, ones connected from the gate to the drain of a transistor, such as by S4, S13, S16, or S23, can be provided to provide addition connectivity.

Moreover, like terminals of different transistors may also be coupled to provide addition meaningful connectivity. For example, one or more of the gate terminals of transistors may be connected together, such as by S1, S9, S17, or S24, or one or more of source or drain terminals may be connected together, such as by S8 or S18. It also is possible to provide additional meaningful connections by providing terminal connections between transistor terminals not otherwise directly coupled, such as by S6. The amount and type of interconnections allow evolution to explore and utilize a variety of basic analog and/or digital circuits, of various granularities such as, for example, current mirror, differential current pair, amplifier, multi-input NAND gate, multi-input XOR gate, inverter, and more, which may be formed through appropriate switch activation, to arrive at a solution.

The types of interconnections represented in FIG. 2 by switches S1–S24, may be used to provide the responsive means. Not all of the switches are necessary. Additionally, other connections not shown may be used. For example, an additional switch may be connected from the drain of P3 to the drain of N8, or across the source and drain of P4. On the other hand, in embodiments where switch state is controlled by serially shifting to each switch to download each bit of the chromosome string, more switch couplings will take more time to program and not necessarily provide additional benefits. Alternatively, some of the transistor bypass switches, such as S12, S15, and S22 may be omitted to facilitate cascading of additional modules.

Furthermore, it is not necessary to provide a module having eight transistors. The number of transistors may be greater or less than eight. The optimal number and arrangement is task dependent. Eight transistors of complimentary conduction types, such as N-type and P-type, is expected to provide a universal application for an evolvable analog circuit. Likewise, pairing the transistors P1–P2, P3–P4, N5–N6, and N7–N8 within the module, as shown in FIG. 2, is not necessary in all embodiments of the present invention. Pairing of the transistors, however, is expected to provide a universal application for an evolvable analog circuit.

Similarly, arranging the transistors in a particular number of layers within the module, such as for example the four layers formed by the transistor pairs P1–P2, P3–P4, N5–N6, and N7–N8, as shown in FIG. 2, is not necessary. Some may have six, eight, or more layers. Fewer layers also is possible (e.g. three or two or possibly a single layer). Providing about four layers of the transistors, however, is expected to provide a universal application for an evolvable analog circuit. The layered structure is patterned after some common designs of analog and digital structures. Other structures may be tailored for a specific application.

In cases, the terminal interconnections are provided to facilitate power flow from power source 10 to power sink 20, along with left to right lateral and/or laterally and downward connection. Such interconnection strategy, with a module output at, for example, P4 and/or N6, and/or others, allows for cascading signal flow to additional modules, which may be added if desired to provide further evolutionary solutions. Further, feedback type interconnections are also possible in some embodiments, within a module, or more preferably between modules.

In FIG. 2, only four layers of pairs of transistors, two PMOS and two NMOS, were chosen for simplicity. The PTA architecture allows the implementation of bigger circuits by cascading PTA modules. Some versions may have each chip implementing one PTA module, or many modules may be present on each chip. To offer sufficient flexibility the module of this embodiment has all transistors terminals, except those connected to power and ground, connected via switches to expansion terminals, not shown, to allow switchable coupling of input and output signals to modules and to allow interconnection between modules to facilitate evolution.

Various module interconnections are possible. For example, some may have modules coupled so that a module is connected to adjacent modules, such as in north, south, east, and west to form a neighborhood, and have additional connectivity with one or more modules from a different neighborhood, such as jumping over a set of modules, for example jumping one to four modules, to a different neighborhood. It is possible to have one to four interconnections locally while having less extending to modules in other neighborhoods.

One implementation for evolvable analog circuits has higher density of module to module interconnections in a center portion of a layout and a lower density of interconnections at the periphery. This is because, in some situations, too many module to module interconnections could complicate evolution and be detrimental to stabilization. In other situations, more interconnections may be necessary to provide a more complicated solution. As this may not be established before array layout and fabrication, a non-homogeneous layout is expected to provide more flexibility when for evolutionary purposes.

Because it is not always known beforehand how many modules are needed to evolve a solution, it may be possible to use many internal test points on the PTA as possible outputs for evaluation of the distance of the response from the target response. This may be implemented using individuals in the same population with different sizes (chromosome length), or simply parallel evaluation of the routed outputs of many circuits. A part of the genetic code could indicate where the output is to be probed.

In some cases, the programmable or reconfigurable switches S1–S24 are implemented with transistors, such as a pair of NMOS-PMOS back to back transistors acting as a simple T-gate switch. In these embodiments, the transistor T-gate switches are selected: to pass analog signals; to have the resistance of each switch is variable between low (approximately tens or hundreds of ohms) and high (in excess of tens and hundreds of Mohms and above); and to preferably provide an intermediate resistance (although its linearity is not necessarily important in these embodiments). In practice, the switches are non-ideal in that they have a big, but finite, resistance in the OFF state (approximately Mohms or Gohms) and a non-zero resistance/impedance in the ON state (approximately tens of Ohms). This feature can facilitate evolution. While the effects of non-ideal switches may be negligible in a first approximation for many digital circuits, such effects may fundamentally affect analog programmable circuits.

Figure 3:
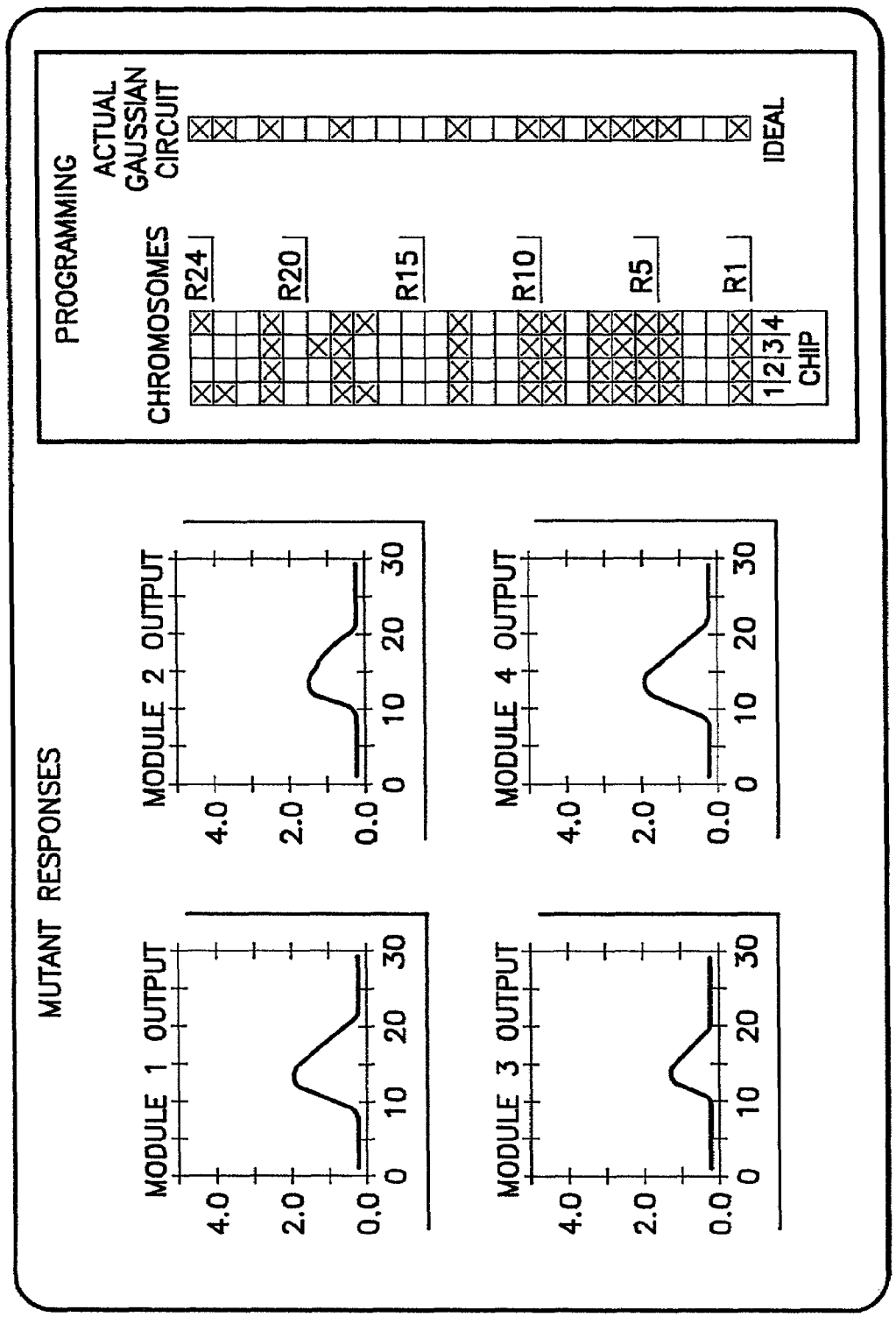
FIG. 3 illustrates several additional circuits obtained by evolution showing less than ideal but possibly useful circuit responses.

Turning to FIG. 3, besides leading to designs that are possible by human designers, evolution with non ideal components can lead to circuits that are unusual from the perspective of typical design practice. For example, synthesis of a DC circuit with a Gaussian response was performed in hardware in four separate chips. The four chips were programmed in parallel with bit-string configurations corresponding to four individuals of a population of 1000; then, the next four were programmed, and so on until all 1000 in one generation were tested. Evolution led to "Gaussian" circuit solutions within 20–30 generations.

In this example, the genetic algorithm parameters in one of the runs are as follows: Population: 1000; Chromosome size: 24 bits (1 PTA); 52–88 bits (2PTAs, variable depending on interconnection schemes); Evaluation samples: 30; Mutation rate: 4%; Cross Over rate: 70%; Tournament Selection: 20 individuals; Elit Strategy: 9% population size (88 individuals); Fitness Function: Square root Mean Error; Fitness [indiv.]=target xi)$^2$–indiv(xi)$^2$}.

FIG. 3 shows four different hardware-evolved mutant solutions for a Gaussian curve provided by modules 1–4. The mutations in the genetic code of the solutions obtained by evolution, depicted vertically as chromosomes R24–R1 that correspond to switches S24–S1 of FIG. 2, may be compared with the human-designed solution of the Gaussian circuit located to the right of R24–R1. While those observed mutants had 2–4 switches away of the same solution humans would design, it is expected this property can be exploited by evolution to ultimately provide quite different solutions, possibly better, than a human designer in other applications. Even if this is not the case, such mutants may increase the number of valid solutions, thus easing the search for a solution. Moreover, it may provide alternate, or backup solutions, that may be used in the event that an evolved solution becomes invalid due to component faults or other irregularity.

Figure 4:
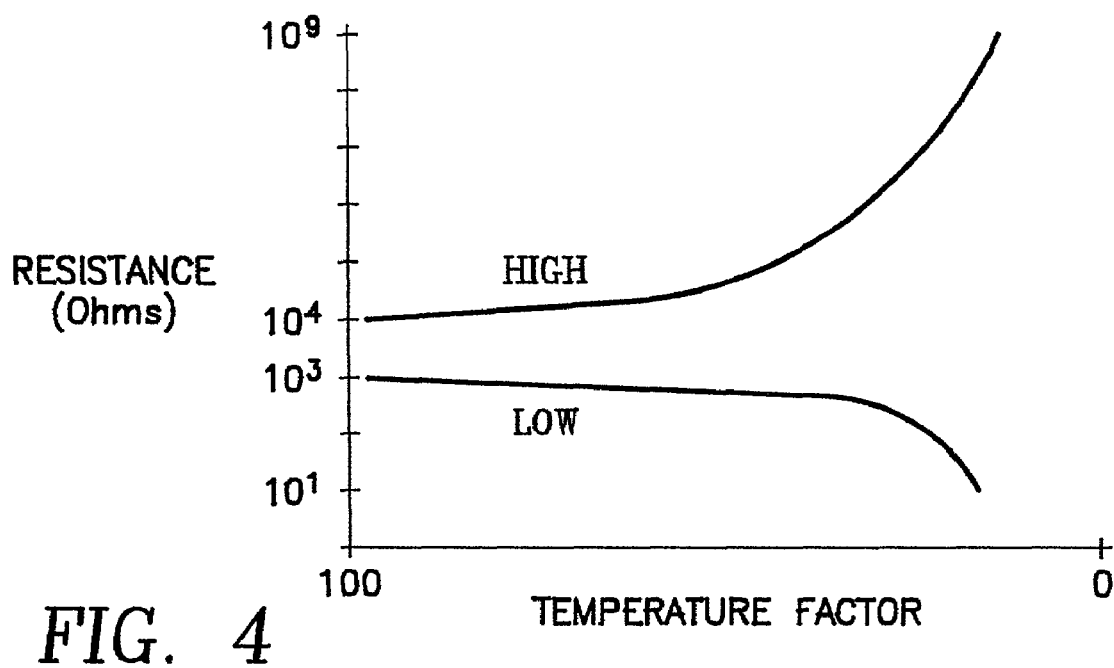
FIG. 4 represents the annealing type process used in some embodiments employing gradual switch states to provide evolution by morphing switch states.

Turning to FIG. 4, other versions may employ gray or gradual switches as the reconfigurable switches S1–S24 of FIG. 2 to introduce an annealing effect to the evolutionary process. Instead of ON/OFF, the switches were considered as having a resistance Low/High (Low for ON state). The binary genetic code would thus specify if the switch is Low or High, but the numerical meaning of this qualitative code (e.g. a resistance related parameter) would change gradually as a function of a temperature-like parameter as illustrated in FIG. 4.

Initially the temperature is high, and Low and High switch status have values close to each other, such as 2 Mohms for Low and 20 Mohms for High. Gradually, the temperature goes down and the switch resistance polarizes to the extremes of for example 10's of Ohms for Low and 10's of Gohms for High. The number of generations was chosen to ensure some quasi-static behavior. This is because the response of the same best individuals from older generation differed in the newer generation because the circuit had different resistance for switches.

This evolution through a gradual morphing process proved more efficient in simulation than searches in which with the switches High or Low of extreme values, such as 10's of Ohms for Low and 10's of Gohms for High, were fixed at all times. Thus, evolution using gradual switch values provided as much as an order of magnitude faster solution.

Many solutions observed while running through this "freezing" process were acceptable solutions with switches partly open, in effect with all transistors taking part in generating the function. Some versions may allow the annealing process to continue until the switch states are frozen or polarized to their full high and low impedance states. This provides more robust solutions, ones that are not as sensitive to thermal changes of transistors, or to other transistor dependent variations. In other versions, the switches may not be completely polarized. In such cases, the annealing process may be shorted, or not used at all, to provide solutions having switch states not completely polarized to their full high and low impedance states. Such solutions may be more desirable in certain instances, such as, for example, where design speed, resources, functionality, or other constraints make such solutions desirable.

In situations where design speed is an important factor, it is possible to provide a fitness function which includes fitness gradient information to characterize the likelihood of success of individuals during the morphing process. As such, individuals not showing sufficient improvement in fitness during the morphing process could be abandoned to expedite the evolution process.

Gradual switches allow variable control over the resistance of the switches so provide a means for variably controlling transistor coupling. The gradual switch may be implemented with transistors, such as a pair of NMOS-PMOS back to back transistors acting as a simple T-gate switch. The switches are selected as discussed above. In the implementation of one embodiment, the meaning of high or low is controlled by an A/D converter, either external or internal to the chip. In such an embodiment, a single bit of the bit string may be represented by several bits to provide adjustment of the value of high and low. Thus, a single bit used to qualitatively represent high or low is delivered to the A/D converter, which in turn provides a quantitative analog value of the high/low states to control the annealing process.

To simplify device fabrication, the resistance value assigned the switches to represent high and low may be controlled together to provide homogeneous control of high/low values of the switches. It also is possible to provide heterogeneous control of the switch annealing process to provide non-uniform, or even individual control of the values representing high and low.

Figure 5:
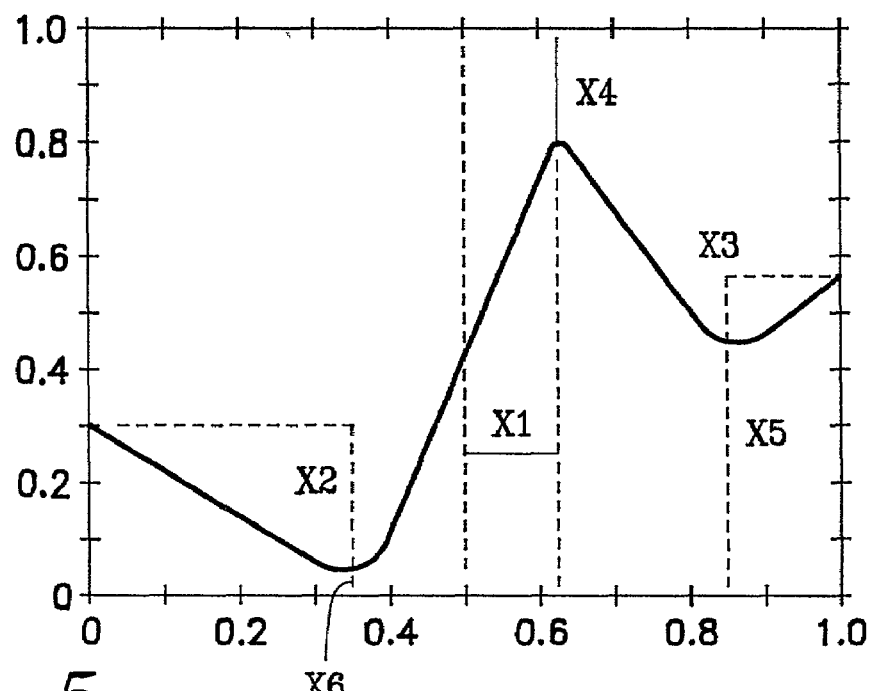
FIG. 5 shows parameter used for specification of a fitness function.

A fitness function which considers shape information by using a weighted combination of parameters x1–x7 as depicted in FIG. 5 also can improve evolution search efficiency over a Euclidian type fitness function in some applications. Fitness functions, such as the one of FIG. 5 used to evolve a Gaussian response circuit, however, generally do not have broad applicability.

Subject Matter of the Present Application:

The purpose of the present invention is to overcome problems arising from limitation inherent in conventional modeling techniques. As briefly mentioned earlier in this specification, there is a trade-off between speed and resolution in modeling circuits, particularly circuits embodying very large systems. When modeling a circuit, the user typically must first choose the resolution level of the model. For example, SPICE offers configurable circuit models of different resolution levels (e.g., SPICE level 5, SPICE level 7). High resolution is desired in a model because, for example in extrinsic models embodied in software, the higher resolution models behave more like their hardware counterparts and are therefore more realistic. On the other hand, such high resolution models are more complex and require solution of a larger number of simultaneous equations, making convergence slower or of an indefinitely long duration if the circuit to be modeled is a highly complex system. Lower resolution models converge rapidly and reliably, but suffer from unrealistic behavior compared to their hardware counterparts, which limits their utility.

One example of how high and low resolution models can differ is in the modeling of the switches S1, S2, S3, etc., of the configurable circuit of FIG. 2. In a low resolution model, each switch can be modeled as a simple ON/OFF device having a very low resistance (e.g., 1 Ohm) in the ON state and a very high resistance (e.g., 1 Giga Ohm) in the OFF state. In a high resolution model, each switch is modeled as it is actually implemented, namely as a pair of parallel complementary MOSFETS using, for example, standard SPICE models for the PMOS and NMOS FET's. This latter model is more complex but exhibits a simulated behavior that more closely resembles the behavior of the actual switch.

The lower level resolution models often fail to provide realistic behavior for any one of a number of reasons. In some cases they may be incomplete. For example, they may lack information about device fabrication, or they may leave out certain circuit details. One example of this is modeling of the CMOS switches used in the configurable circuit of FIG. 2 as simple binary devices. Another reason for failure is lack of information about initial conditions in the hardware, such as temperature, radiation and other operating conditions. Also, certain components may undergo slow charging over time that the model fails to take into account.

The basic problem is that in evolving a complex system or circuit, the high resolution models correspond to realistic solutions but may not be able to converge during simulation, while lower resolution models can readily converge but do not provide realistic simulation of actual hardware.

Figure 6A:
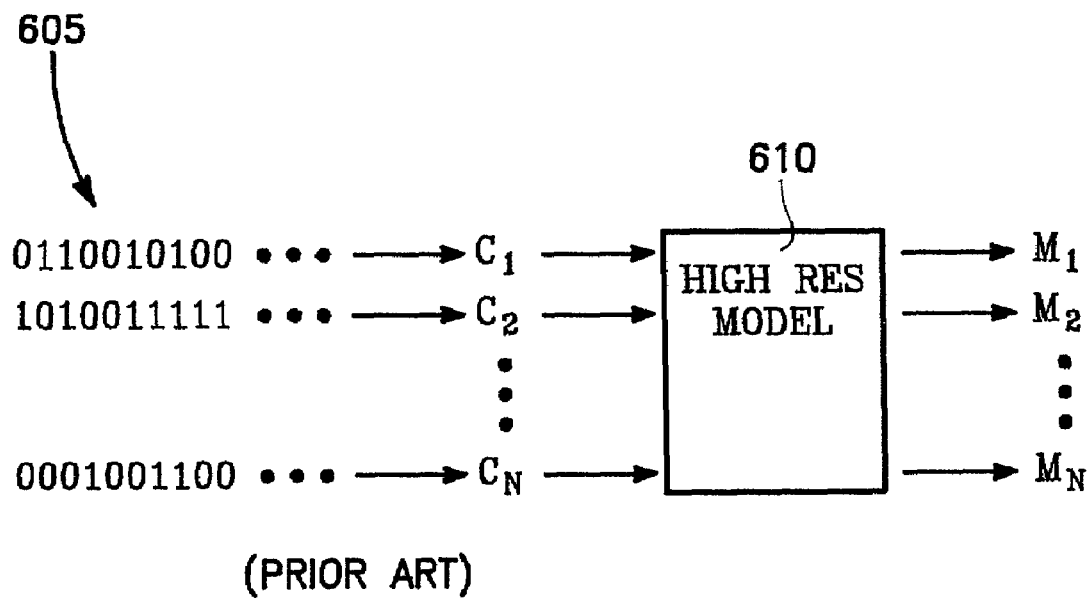
FIGS. 6A and 6B illustrate one technique of the prior art.
Figure 6B:
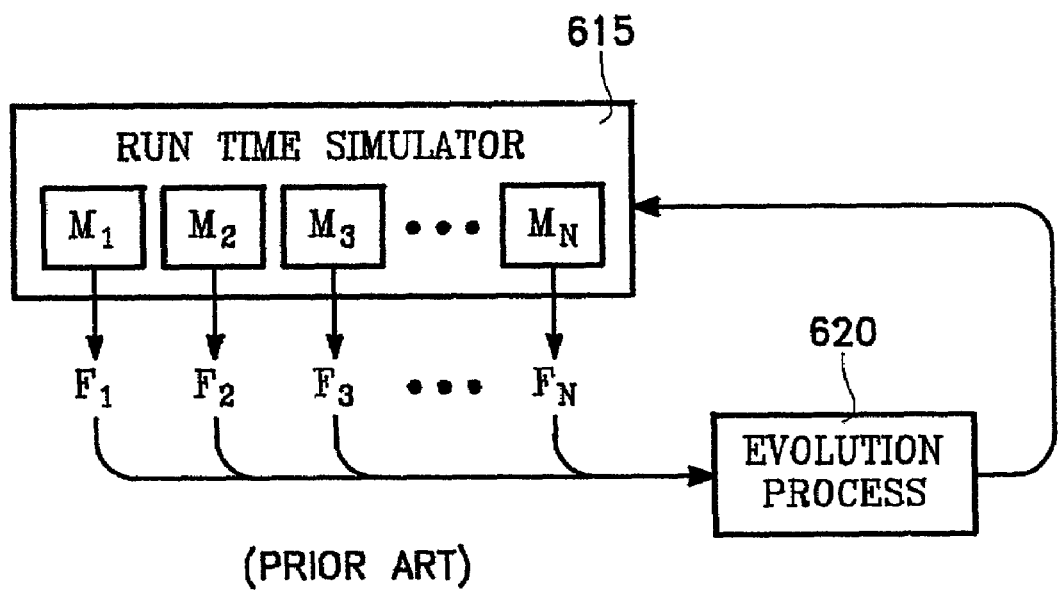

Referring to FIGS. 6A and 6B, a set of candidate circuits C1 through CN (representing, for example, different configurations of the reconfigurable circuit of FIG. 2) is defined by a set of "chromosomes" 605 that are fed to a high resolution model 610 to produce N high resolution models M1 through MN. A run time simulator 615 simulates the physical behavior of each of the models M1 through MN (one at a time) in response to a predetermined stimulus (it is possible, however, to run many separate simulations in parallel). The run time simulator 615 compares the response of each model to a desired response and produces a fitness function (representing this comparison) for each model, namely the fitness functions F1 through FN. A standard evolution process 620 selects from among the best performing ones of the candidate circuits C1-CN in a conventional manner.

Figure 7A:
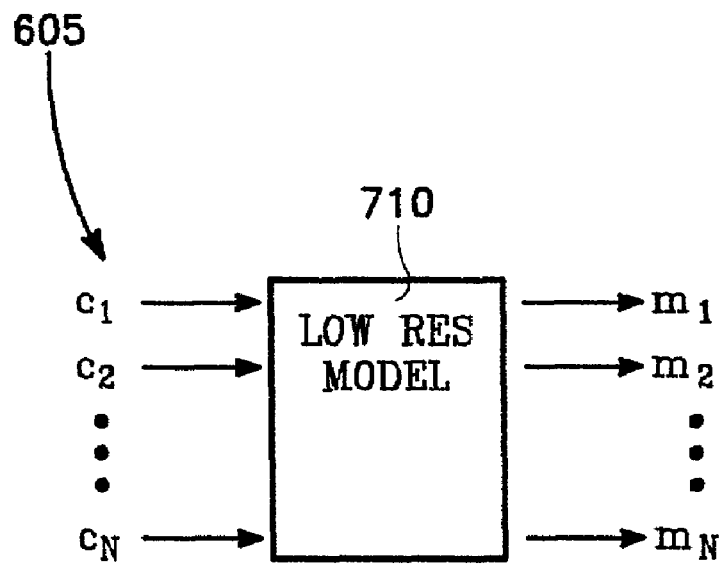
FIGS. 7A and 7B illustrate another technique of the prior art.
Figure 7B:
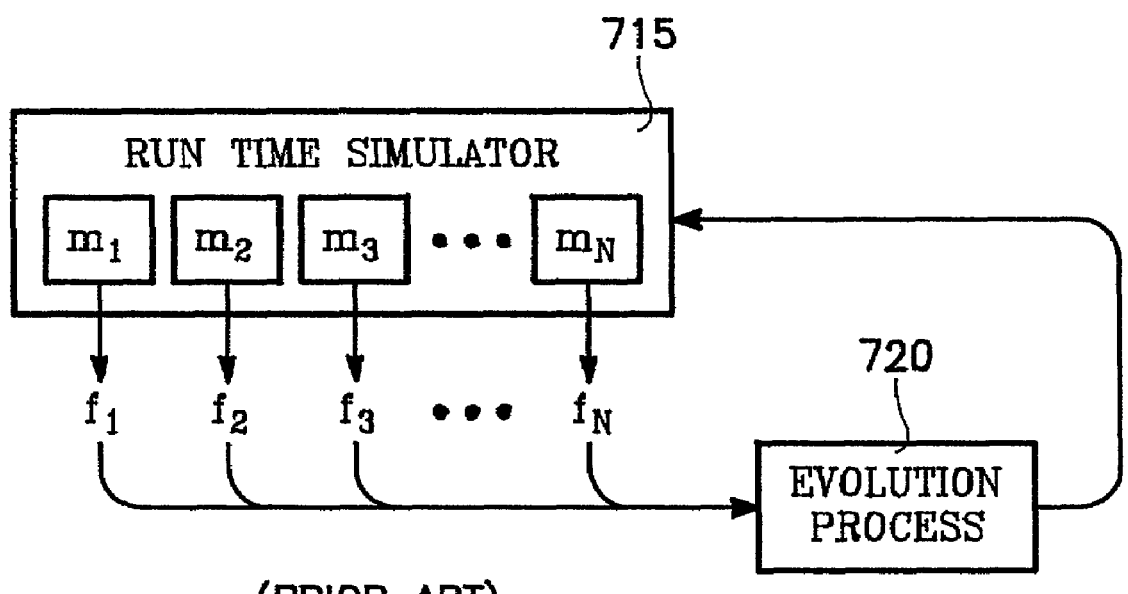

Referring to FIGS. 7A and 7B, a set of candidate circuits c1 through cN is defined by the set of "chromosomes" 605 that are fed to a low resolution model 710 to produce N low resolution models m1 through mN. The candidate circuits c1 through cN in some cases may differ somewhat from the candidate circuits C1 through CN of FIGS. 6A and 6B in order to be compatible with the low resolution model 710. A run time simulator 715 simulates the physical behavior of each of the models m1 through mN (one at a time) in response to a predetermined stimulus. The run time simulator 715 compares the response of each model m1 through mN to a desired response and produces a fitness function (representing this comparison) for each model, namely the fitness functions f1 through fN. A standard evolution process 720 selects from among the best performing ones of the candidate circuits c1–cN in a conventional manner.

The problem is that one must choose between two sets of results, a high resolution model (FIGS. 6A and 6B) which may not have converged if the candidate circuits C1–CN are too complex, and a low resolution model (FIGS. 7A and 7B) whose results may not provide any hardware-reproducible circuits due to oversimplification of the model.

Figure 8:
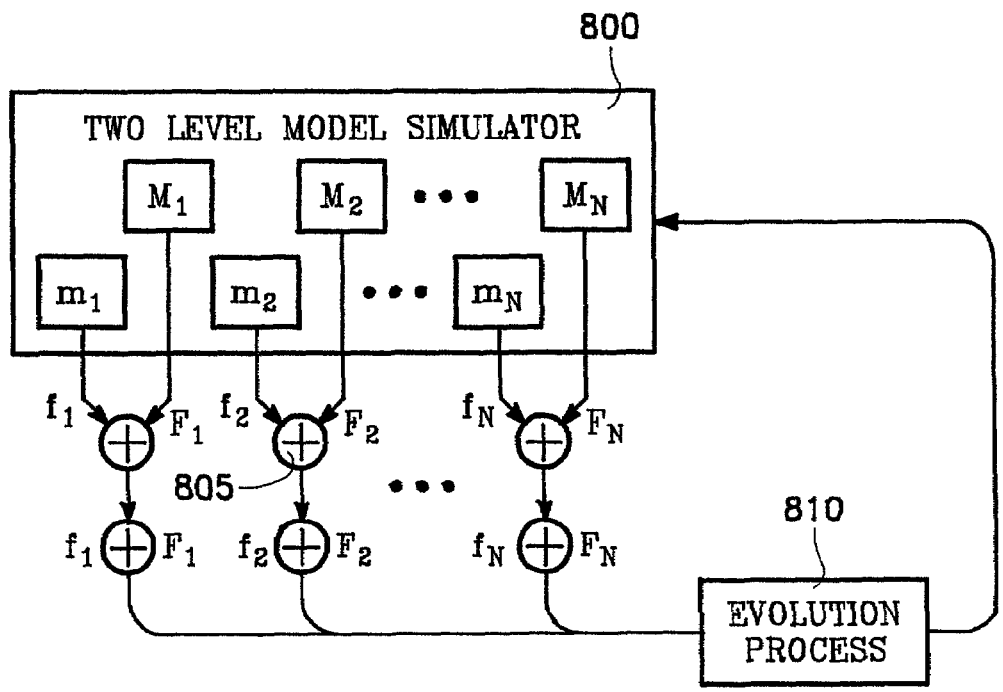
FIG. 8 illustrates a first embodiment of the present invention.

A first embodiment of the present invention is illustrated in FIG. 8. Each one of the candidate circuit C1 through CN is modeled by both a high resolution model and a low resolution model in a simulator 800. Thus, for the N candidate circuits C1 through CN, there are N pairs of models M1, m1 through MN, mn. There are N high resolution models M and N low resolution models m. The pair of high/low resolution models (e.g., M2 and m2) representing a particular candidate circuit (e.g., C2) produce a pair of fitness functions (e.g., F2 and f2). A combiner 805 combines each pair of fitness functions to produce a combined score for the corresponding candidate circuit. For example, the combiner 805 may compute the average of the two fitness functions as the combined fitness function or score. The combined score for each candidate circuit is provided to an evolution process 810 that controls the simulator 800 in a conventional manner. The average may be a weighted average in which, for example, the fitness function of a higher resolution model is given more (or less) weight than that of a lower resolution model. Alternatively, the average may be unweighted.

Figure 9:
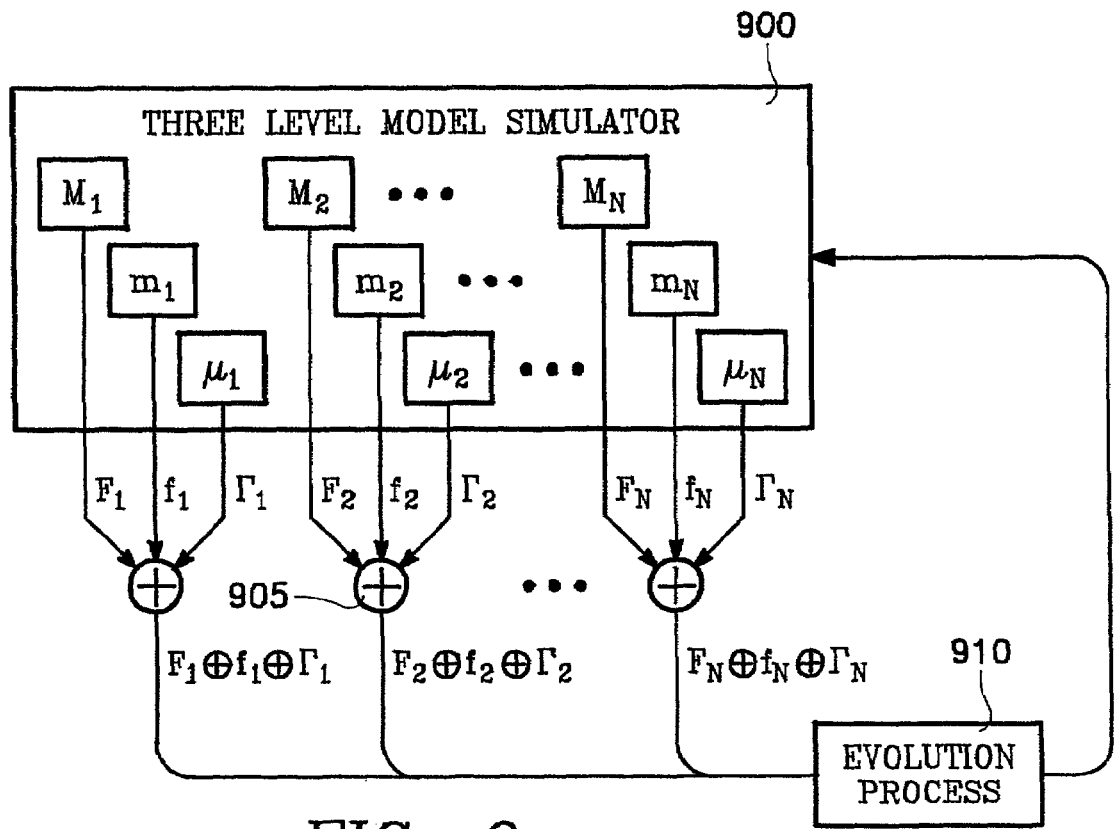
FIG. 9 illustrates a second embodiment of the present invention.

Referring to FIG. 9, each one of the candidate circuit C1 through CN is modeled by a high resolution model, a low resolution model and a lowest resolution model in a simulator 900. Thus, for the N candidate circuits C1 through CN, there are N triplets of models M1, m1, $\mu$1 through MN, mn, $\mu$n. There are N high resolution models M, N low resolution models m and N lowest resolution models $\mu$. The triplet of high/low resolution models (e.g., M2, m2, $\mu$2) representing a particular candidate circuit (e.g., C2) produces a triplet of fitness functions (e.g., F2, f2, F2). A combiner 905 combines each triplet of fitness functions to produce a combined score for the corresponding candidate circuit. For example, the combiner 905 may compute the average of the three fitness functions as the combined fitness function or score. The combined score for each candidate circuit is provided to an evolution process 910 that controls the simulator 900 in a conventional manner. Other versions of the foregoing embodiment may employ more than three levels of resolution for each candidate circuit.

Figure 10:
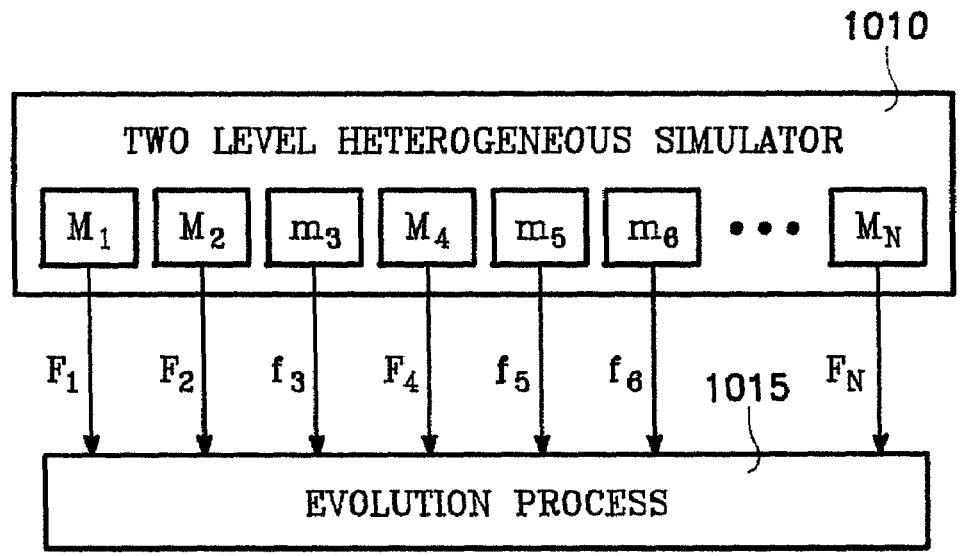
FIG. 10 illustrates a third embodiment of the present invention.

Referring now to FIG. 10, great computational savings may be realized by employing only one model for each candidate circuit during any single iteration of the evolution process. With each iteration of the evolution process, a different resolution level model is assigned to each (or at least many) of the candidate circuits. As a result, after a number of iterations, each candidate circuit has been modeled with all levels of resolution. Such assignments may be carried out in a random fashion. In the evolution process iteration of FIG. 10, the simulator 1010 is given one model for each candidate circuit, different candidate circuits being modelled with a model of a different resolution level. Thus, the first two candidate circuits C1 and C2 are modelled with a high resolution model (M1, M2 respectively) while the third candidate circuit C3 is modeled with a low resolution model (m3). The simulator 1010 produces a fitness function from each model (F1, F2, f3, etc.) which is provided to a conventional evolution process 1015.

Figure 11:
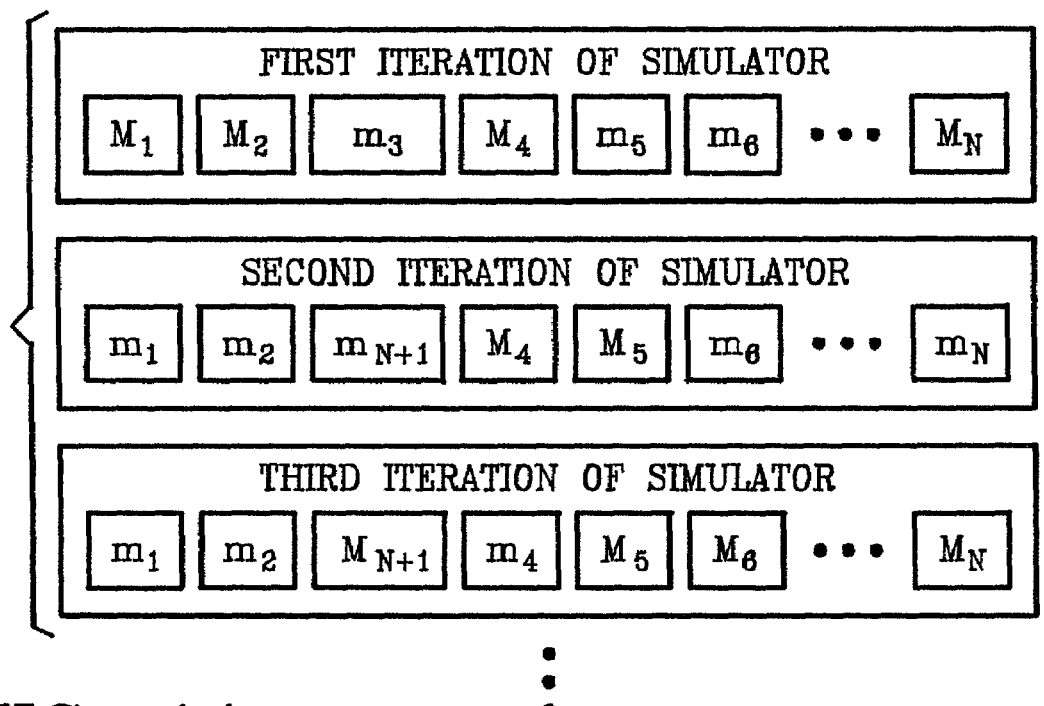
FIG. 11 illustrates a process of reassigning resolution levels among candidate circuits in successive iterations in the embodiment of FIG. 10.

FIG. 11 shows one possible pattern of assignments of the candidate circuits among the models of different resolution levels over three successive iterations of the evolution process. In the example of FIG. 11, the candidate circuit C3 is eliminated after the first iteration (presumably because of a poor score or fitness function), and another candidate circuit CN+1 is substituted instead. In the example of FIG. 11, not all of the assignments of candidate circuits to different resolution models are changed each iteration. However, a sufficient fraction of them is changed so that after only several iterations, all of the candidate circuits still surviving have been modeled with all resolution models. By not introducing all possible candidate circuit in the initial iteration and distributing the introduction of the candidate circuits over time while various ones are eliminated, the search space is reduced and the evolution process is expedited.

Figure 12:
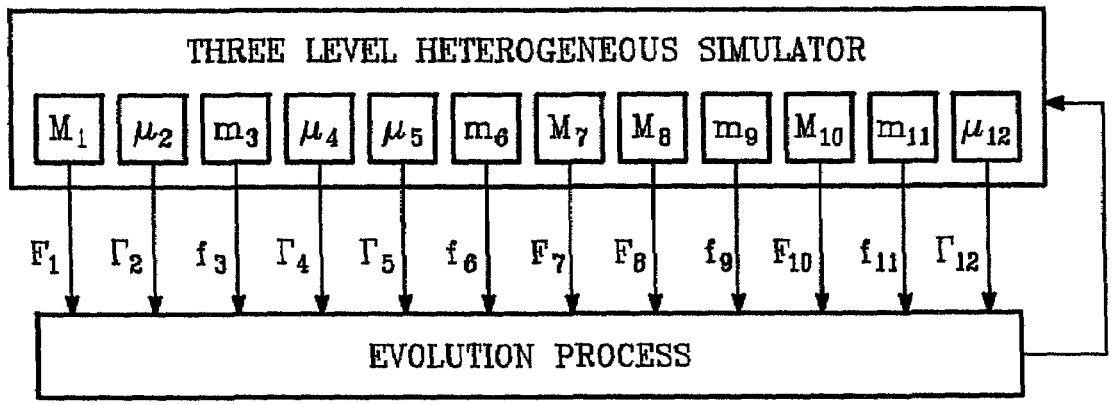
FIG. 12 illustrates a fourth embodiment of the invention.
Figure 13:
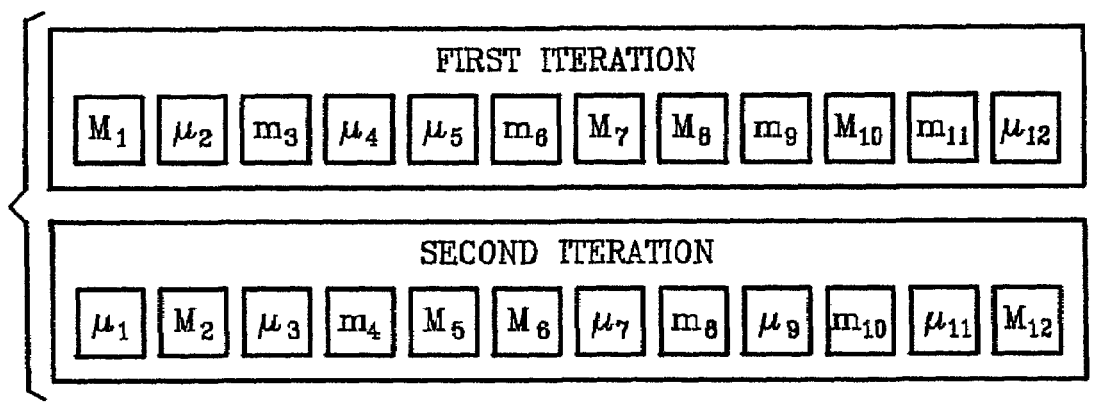
FIG. 13 illustrates a process of reassigning resolution levels among candidate circuits in successive iterations in the embodiment of FIG. 12.

FIG. 12 illustrates the concept of FIG. 10, but carried out with models of three different resolution levels instead of only two. FIG. 13, like FIG. 11, illustrates the pattern of changing resolution level assignments for the various candidate circuits over two iterations of the simulator. More than two or three resolution levels may be employed in this manner.

The assignment of a particular candidate circuit to a model of a particular resolution level preferably, but not necessarily, is performed randomly so that the different resolution levels are distributed among all candidate circuit. Likewise, the transition at the end of each iteration of various candidate circuits to models of different resolution levels preferably, but not necessarily, is carried out in a random manner. Such random processes may be carried out in accordance with instructions furnished to the evolution process.

Figure 14:
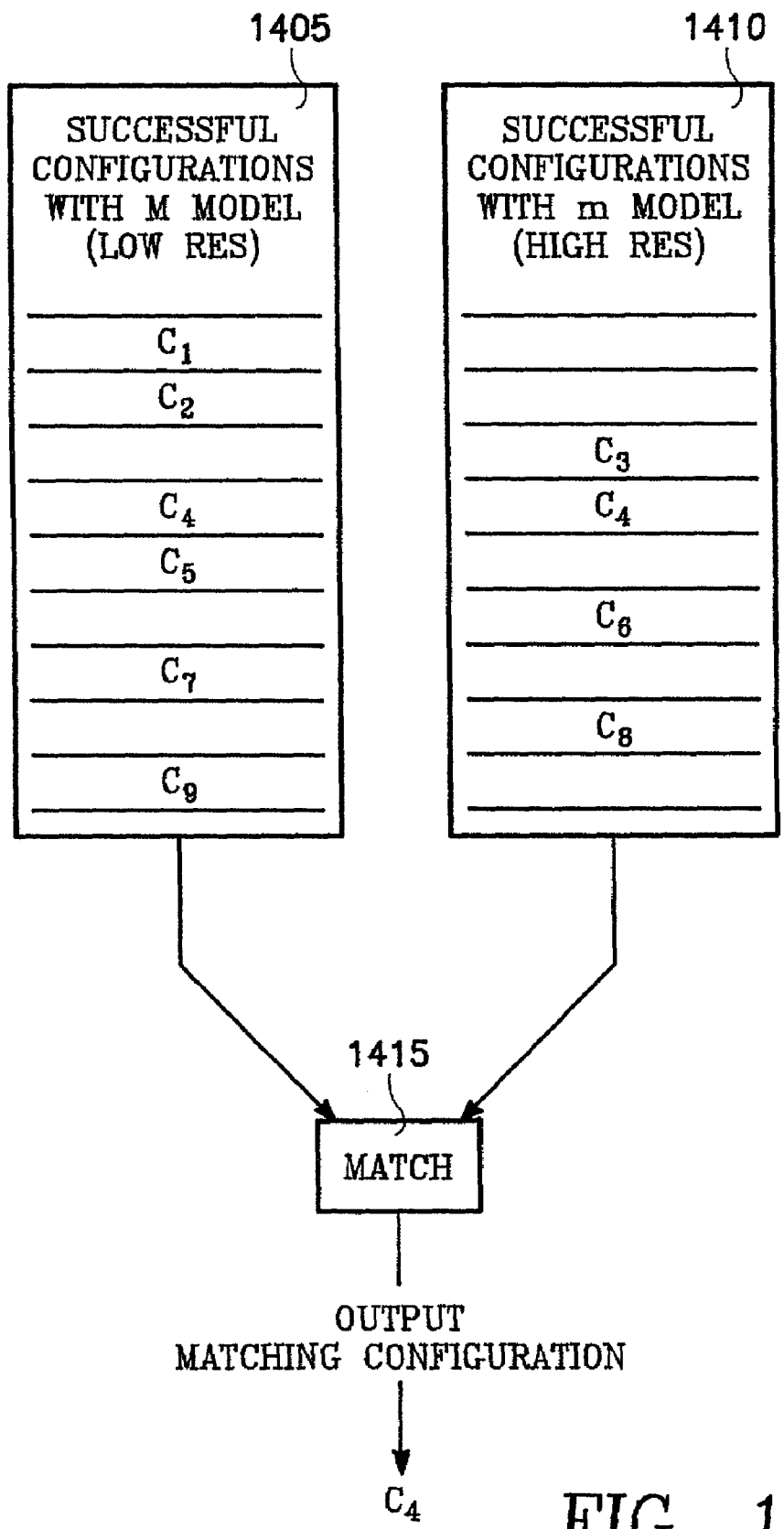
FIG. 14 illustrates a method of the invention for eliminating successful competing solutions obtained in different resolution levels.

Typically, the evolution process can identify more than one candidate circuit that has a superior fitness function or score, at least when evaluated under one model of a particular resolution level. One feature of the present invention is to eliminate many of such candidate circuits by retaining only those candidate circuit exhibiting superior fitness functions or scores when evaluated under all models of different resolution levels. FIG. 14 illustrates this concept, in which the evolution process stores successful candidate circuits having successful scores when modeled with the high resolution model M in a list 1405, and stores successful candidate circuits having successful scores when modeled with the low resolution model m in a list 1410. A match 1415 is found among the two lists, the match being satisfied only by the candidate circuit C4. In this example, C4 is the only survivor of all the candidate circuits.

Figure 15:
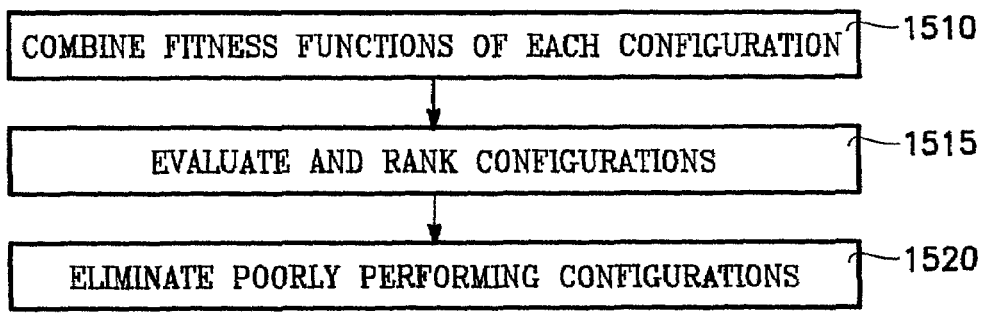
FIG. 15 illustrates a process carried out in the embodiment of FIG. 8.

FIG. 15 illustrates one iteration of an evolution process for the embodiment of FIG. 8. First, the fitness functions of each model pair are combined pair-wise (block 1510). Then, the combined fitness functions are evaluated and ranked (block 1515). Finally, those candidate circuit having relatively inferior combined fitness functions are eliminated from consideration prior to the start of the next iteration (block 1520).

Figure 16:
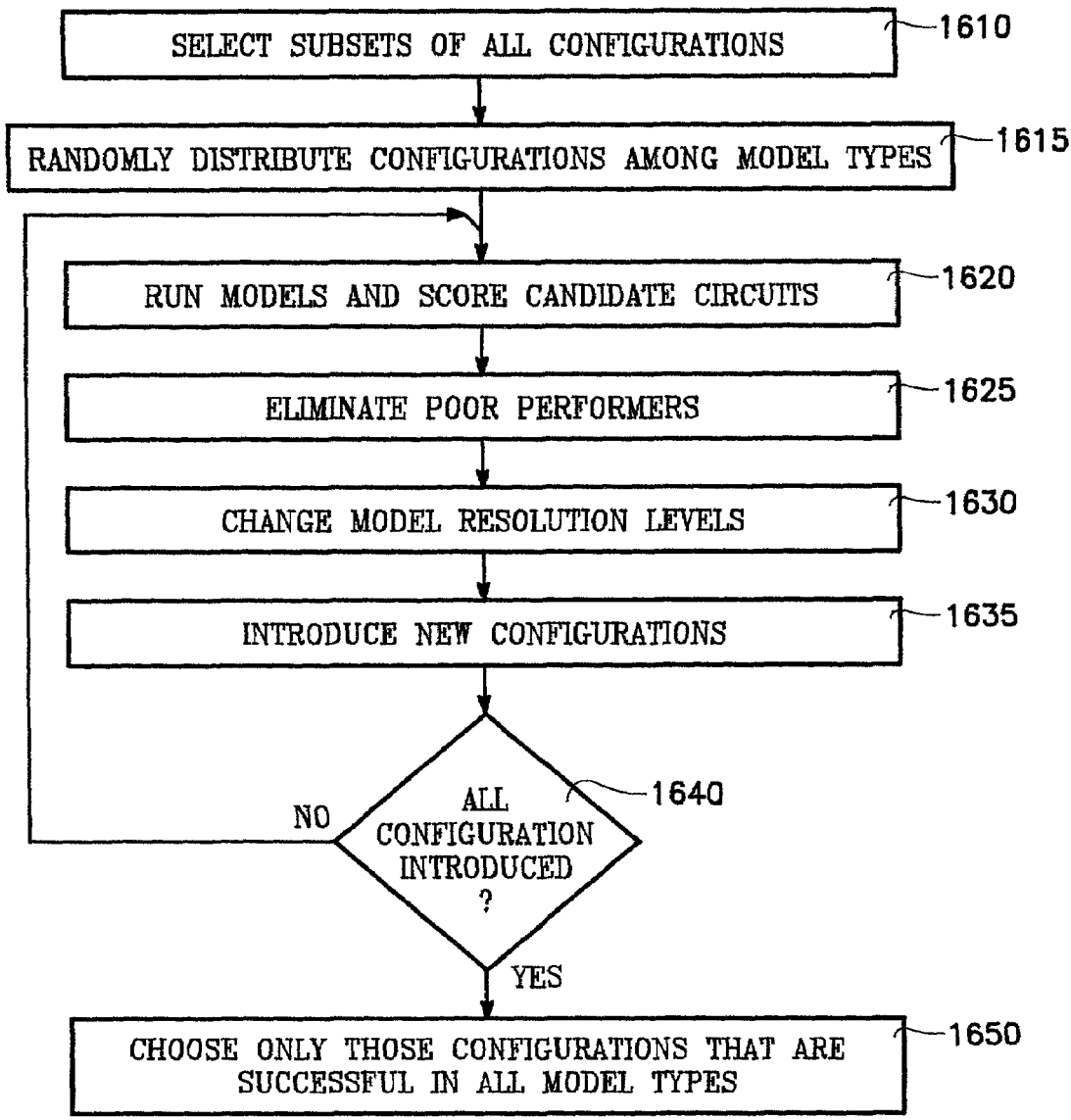
FIG. 16 illustrates a process carried out in the embodiment of FIG. 10.

FIG. 16 illustrates one iteration of an evolution process for the embodiment of FIG. 10. First, a set of all possible candidate circuits is selected (block 1610) and these are each individually assigned models of different resolution levels (block 1615). The simulator then runs the model of each selected candidate circuit and issues a score (block 1620), and those with inferior scores are eliminated (block 1625). Then, many or all of the selected candidate circuits are assigned to a model of a different resolution level (different from that of the previous assignment) (block 1630). New candidate circuits may be introduced (block 1635). This completes one iteration, and unless or until a model with satisfactory scores at all resolution levels has been introduced (block 1640), the process returns to block 1620) to begin the next iteration. Once all candidate circuits have been introduced (block 1635), all results are compared, and only those candidate circuits having superior scores are retained (block 1650).

While the preferred embodiments and methods of the present invention have been described in detail above, many changes to these embodiments and methods may be made without departing from the true scope and teachings of the present invention. The present invention, therefore, is limited only as claimed below and the equivalents thereof.

What is claimed is:

1. A method of designing an electronic circuit from plural candidate circuits, comprising:

assigning each one of a plurality of configurable circuit models of different levels of model resolutions to different individual ones of at least a subset of said plural candidate circuits;

producing plural simulation models for each one of at least said subset of said candidate circuits by configuring each configurable model in accordance with the one candidate circuit, whereby to produce a plurality of simulation models corresponding to different levels of model resolutions;

obtaining from each simulation model a fitness function of the corresponding candidate circuit;

ranking said candidate circuits in accordance with said fitness functions;

changing assignments of candidate circuits among said configurable circuit models; and repeating the steps of producing, obtaining and ranking, whereby to perform them in successive iterations.

2. The method of claim 1 wherein said ranking step is followed by a step of eliminating candidate circuits corresponding to inferior ranking.

3. The method of claim 2 wherein said ranking step is followed by a step of adding another of said candidate circuits to said subset of candidate circuits.

4. The method of claim 1 wherein the step of assigning is carried out by randomly assigning ones of said plural configurable models to ones of said plural candidate circuits.

5. The method of claim 1 wherein the step of assigning is carried out so that each candidate circuit of said subset of candidate circuits is assigned to each of said configurable models of different resolution levels within a finite number of said iterations.

6. The method of claim 1 wherein said ranking step includes comparing fitness functions of a candidate circuit obtained during respective ones of said iterations from models of different resolutions.

7. The method of claim 6 wherein said ranking step includes retaining a candidate circuit whose fitness functions obtained with models of different resolution levels are superior.

8. A method of designing an electronic circuit from plural candidate circuits, comprising:

assigning every one of a plurality of configurable circuit models of different levels of model resolutions to each one of at least a subset of said plural candidate circuits;

producing plural simulation models for each one of at least said subset of said candidate circuits by configuring each configurable model in accordance with the one candidate circuit, whereby to produce a plurality of simulation models for each candidate circuit;

obtaining from the plurality of simulation models of each candidate circuit a plurality fitness functions of the corresponding candidate circuit, and combining said plurality of fitness functions into a single fitness function of the one candidate circuit;

ranking said candidate circuits in accordance with their fitness functions.

9. The method of claim 8 wherein said plural configurable models constitute three models corresponding to three different levels of resolution.

10. The method of claim 8 wherein said plural configurable models constitute two models corresponding to two different levels of resolution.

11. The method of claim 8 wherein said ranking step is followed by a step of eliminating candidate circuits corresponding to inferior ranking.

12. The method of claim 11 wherein said ranking step is followed by a step of adding another of said candidate circuits to said subset of candidate circuits.

13. The method of claim 8 wherein the step of combining said fitness functions comprises forming an average of said fitness functions.

14. The method of claim 13 wherein said average is a weighted average.

15. A method of designing an elecontroic circuit comprising modeling plural candidate circuits at different levels of resolution over a plurality of iterations.

16. The method of claim 15 wherein each candidate circuit is modeled a plurality of times using models corresponding to all levels of resolution, and wherein fitness functions obtained from said models for each candidate circuit are combined in evaluating the candidate circuit.

17. The method of claim 15 wherein a candidate circuit is modeled at a single resolution during a single iteration, different candidates being assigned to models of different resolution levels during various iterations.

18. The method of claim 17 wherein each candidate circuit is modeled at all levels of resolution within a finite number of said iterations.

19. The method of claim 17 wherein not all candidate circuits are assigned to a different resolution level model at each iteration.

\* \* \* \* \*